(12) United States Patent
Komori et al.

(10) Patent No.: US 10,973,137 B2
(45) Date of Patent: Apr. 6, 2021

(54) CIRCUIT DEVICE, METHOD FOR MANUFACTURING CIRCUIT DEVICE AND CONNECTOR

(71) Applicants: AutoNetworks Technologies, Ltd., Mie (JP); Sumitomo Wiring Systems, Ltd., Mie (JP); SUMITOMO ELECTRIC INDUSTRIES, LTD., Osaka (JP)

(72) Inventors: Hirokazu Komori, Mie (JP); Naomichi Kawashima, Mie (JP); Hiroki Hirai, Mie (JP); Makoto Higashikozono, Mie (JP); Masanori Moriyasu, Mie (JP)

(73) Assignees: AutoNetworks Technologies, Ltd.; Sumitomo Wiring Systems, Ltd.; Sumitomo Electric Industries, Ltd.

( * ) Notice: Subject to any disclaimer, the term of this patent is extended or adjusted under 35 U.S.C. 154(b) by 0 days.

(21) Appl. No.: 16/630,138

(22) PCT Filed: Jun. 26, 2018

(86) PCT No.: PCT/JP2018/024097
§ 371 (c)(1),
(2) Date: Jan. 10, 2020

(87) PCT Pub. No.: WO2019/012977
PCT Pub. Date: Jan. 17, 2019

(65) Prior Publication Data
US 2020/0137904 A1    Apr. 30, 2020

(30) Foreign Application Priority Data
Jul. 12, 2017   (JP) .............................. JP2017-135952

(51) Int. Cl.
*H05K 5/00*    (2006.01)
*H01R 13/50*   (2006.01)
(Continued)

(52) U.S. Cl.
CPC ........... *H05K 5/0034* (2013.01); *H01R 13/50* (2013.01); *H05K 3/284* (2013.01); *H05K 5/0069* (2013.01);
(Continued)

(58) Field of Classification Search
CPC .......... H05K 3/284; H05K 5/00; H05K 5/034; H05K 5/064; H05K 1/11; H05K 1/18;
(Continued)

(56) References Cited

U.S. PATENT DOCUMENTS 9,510,438 B2 * 11/2016 Wakana ................ H05K 7/2039
9,736,952 B2 *  8/2017 Kajiwara ............... H05K 5/006
(Continued)

FOREIGN PATENT DOCUMENTS

JP       10-076528      3/1998
JP       10-223667      8/1998
(Continued)

OTHER PUBLICATIONS

International Search Report dated Aug. 14, 2018.

*Primary Examiner* — Peter G Leigh
(74) *Attorney, Agent, or Firm* — Gerald E. Hespos; Michael J. Porco; Matthew T. Hespos

(57) ABSTRACT

An ECU 1 includes a circuit board 10, a connector 20 fixed to the circuit board 10 and a resin portion 50 covering the circuit board 10 and the connector 20. The connector 20 includes a housing body 22 and a cut-off receiving portion 27 projecting from the housing body 22. The cut-off receiving portion 27 includes a flange portion 28 projecting outward from the housing body 22 and a flexible wall 29 extending from the flange portion 28 and inclined to be closer to the housing body 22 toward a tip, and a part of the flexible wall 29 is embedded in the resin portion 50.

10 Claims, 6 Drawing Sheets

(51) Int. Cl.
*H05K 3/28* (2006.01)
*H05K 1/18* (2006.01)
(52) U.S. Cl.
CPC ..... *H05K 1/18* (2013.01); *H05K 2201/10189* (2013.01); *H05K 2203/1327* (2013.01)
(58) Field of Classification Search
CPC . H05K 2201/10189; H05K 2201/1327; H05K 13/50
USPC .......................................................... 439/55
See application file for complete search history.

(56) References Cited

U.S. PATENT DOCUMENTS

| | | | |
|---|---|---|---|
| 9,743,539 B2 * | 8/2017 | Kajiwara | ............. B23K 35/262 |
| 2001/0017767 A1 | 8/2001 | Kitamura et al. | |
| 2016/0309600 A1 * | 10/2016 | Kajiwara | ............. H05K 5/0069 |

FOREIGN PATENT DOCUMENTS

| | | | | |
|---|---|---|---|---|
| JP | 10223667 A | * | 8/1998 | |
| JP | 2001-237557 | | 8/2001 | |
| JP | 2010-040992 | | 2/2010 | |

* cited by examiner

CIRCUIT DEVICE, METHOD FOR MANUFACTURING CIRCUIT DEVICE AND CONNECTOR

BACKGROUND

Field of the Invention

This specification relates to a circuit device, a method for manufacturing a circuit device and a connector.

Related Art

Japanese Unexamined Patent Publication No. 2010-40992 discloses a structure in which an entire circuit board and a part of a connector fixed to the circuit board are covered by molding resin to achieve a circuit device waterproof structure with a circuit board and a connector fixed to the circuit board. The molding resin is formed by setting the circuit board and the connector in a mold and filling resin in a molten state into the mold.

Upper and lower molds strongly sandwich the connector housing during molding to cut off a flow of the resin between the connector housing, thereby restricting the leakage of the molten resin to the outside of the mold (such cut-off of the flow of resin is referred to as "resin cut-off" and a part for cutting off the resin in the mold is referred to as a cut-off portion). At this time, the connector housing may be deformed if the mold is pressed strongly against the connector housing to reliably cut off the resin.

SUMMARY

A circuit device disclosed by this specification includes a circuit board, a connector fixed to the circuit board, and a resin portion covering the circuit board and the connector. The connector includes a housing body and a cut-off receiving portion projecting from the housing body. The cut-off receiving portion includes a projection projecting out from the housing body and an inclined wall extending from the projection and inclined to be closer to the housing body toward a tip. A part of the inclined wall is embedded in the resin portion.

Further, a method for manufacturing a circuit device disclosed by this specification includes a setting step of setting a circuit board and a connector fixed to the circuit board in a mold, and a resin portion forming step of forming a resin portion covering the circuit board and the connector by pouring molten resin into the mold and curing the molten resin. The mold includes a cut-off portion for cutting off a flow of the resin to outside of the mold between the mold and the connector by pressing the connector. The connector includes a housing body and a cut-off receiving portion projecting from the housing body, the cut-off receiving portion includes a projection projecting out from the housing body and a flexible wall extending from the projection and deflectable toward the housing body. The cut-off portion presses the flexible wall in the resin portion forming step.

According to the above configurations, a pressing force from the cut-off portion provided in the mold can be received by the flexible wall (inclined wall) in the step of molding the resin portion, thereby suppressing deformation of the housing body.

In the above configurations, the housing body may include a tubular receptacle capable of accommodating a mating connector inside, and the cut-off receiving portion may be continuous from the receptacle.

Since the receptacle is hollow inside, there is a high possibility of deformation if a part for receiving the pressing force by the cut-off portion of the mold is the receptacle for the design convenience of the circuit device. In such a case, the deformation of the receptacle can be suppressed by configuring the cut-off receiving portion continuous from the receptacle.

In the above configurations, the cut-off receiving portion may be arranged over an entire periphery of the housing body. According to this configuration, the deformation of the housing body can be avoided reliably.

According to the circuit device, the method for manufacturing a circuit device and the connector disclosed by this specification, the deformation of the housing body due to a pressing force from the mold can be suppressed.

DETAILED DESCRIPTION

Figure 1:
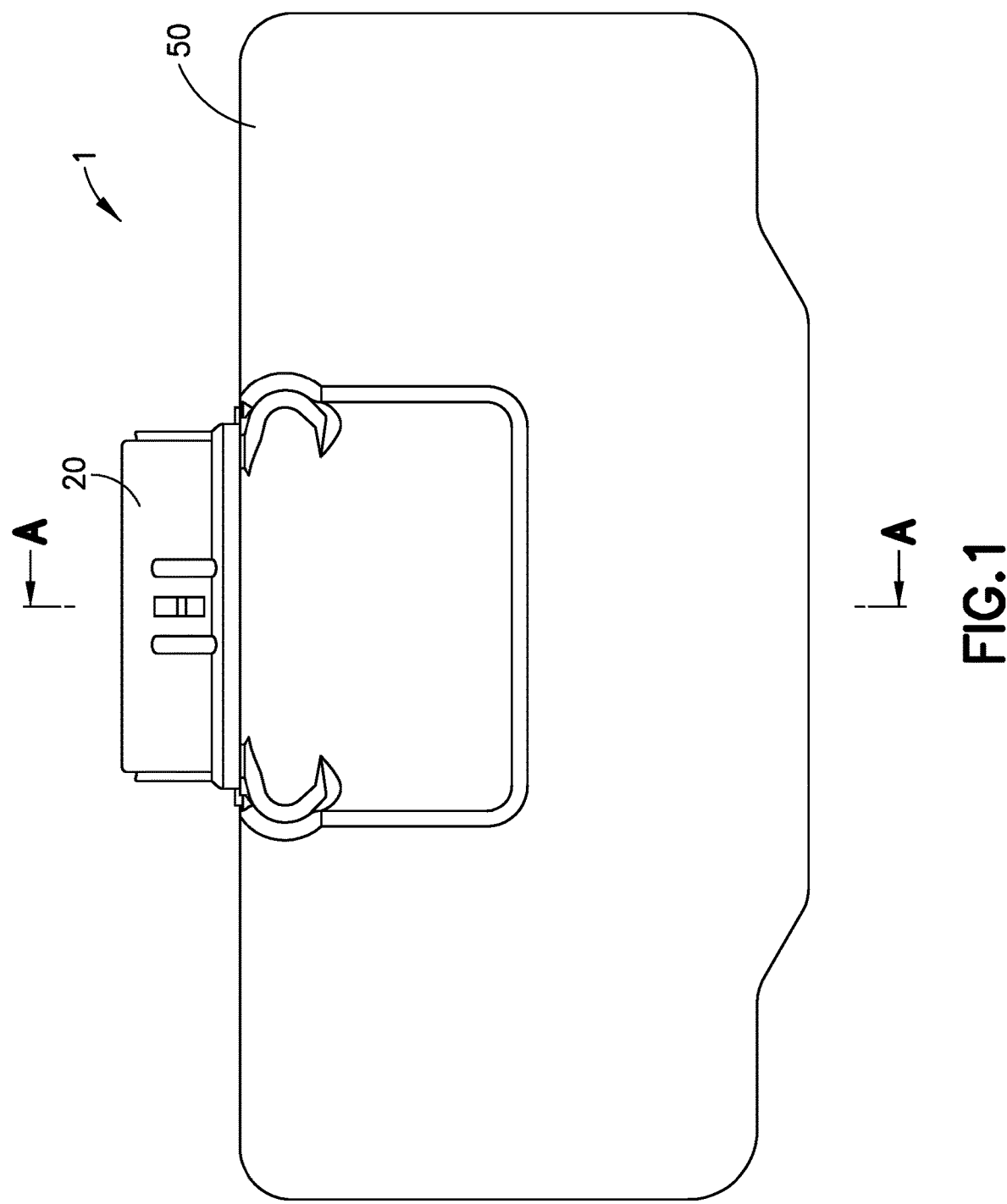
FIG. 1 is a plan view of an ECU of an embodiment.
Figure 2:
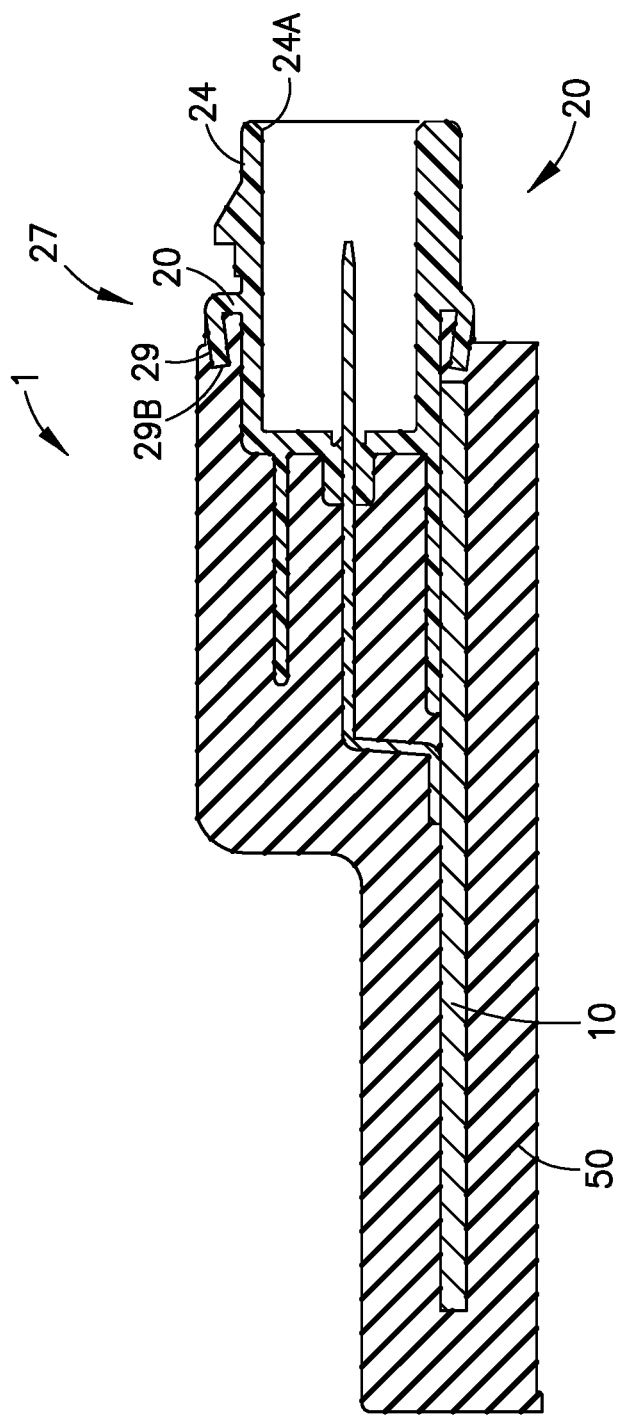
FIG. 2 is a section along A-A of FIG. 1.

An embodiment is described with reference to FIGS. 1 to 7. A circuit device of this embodiment is an ECU (Electrical Control Unit) 1 disposed in a tire house of a vehicle in an electric brake system for controlling braking. As shown in FIG. 2, the ECU 1 includes a circuit board 10, a connector 20 fixed to the circuit board 10 and a resin portion 50 formed of synthetic resin by molding and covering the circuit board 10 and the connector 20.

The circuit board 10 is a member having a known configuration in which conductive paths (not shown) are formed by a printed wiring technique and electronic components (not shown) are mounted on one or both surfaces of an insulating plate made of an insulating material.

Figure 3:
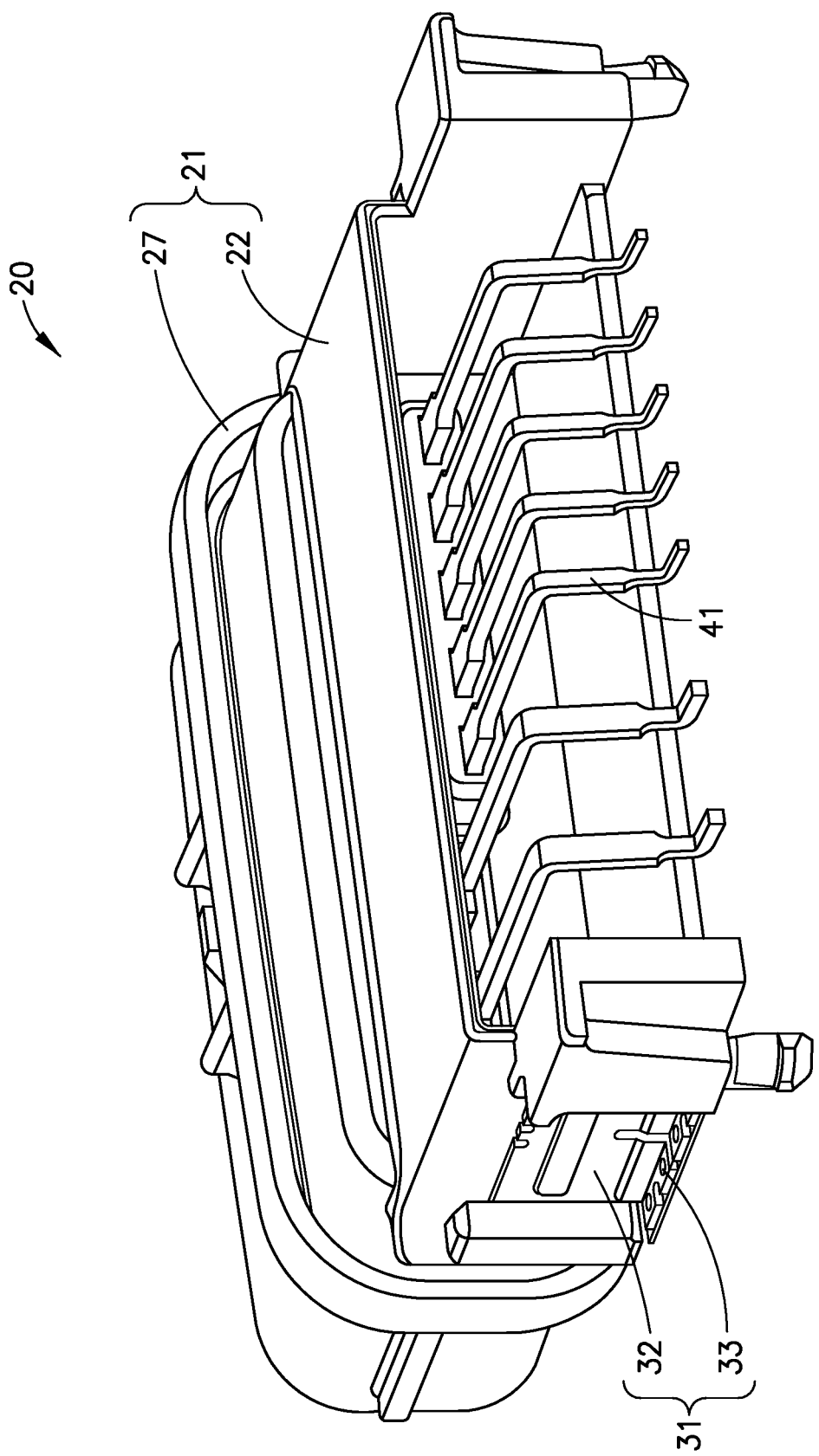
FIG. 3 is a perspective view of a connector of the embodiment.

As shown in FIG. 3, the connector 20 includes a connector housing 21, two fixing brackets 31 for fixing the connector housing 21 to the circuit board 10 and terminal fittings 41 mounted into the connector housing 21 and to be connected to the conductive paths on the circuit board 10.

The connector housing 21 is made of synthetic resin and includes, as shown in FIG. 3, a housing body 22 and a cut-off receiving portion 27 continuous from the housing body 22.

Figure 6:
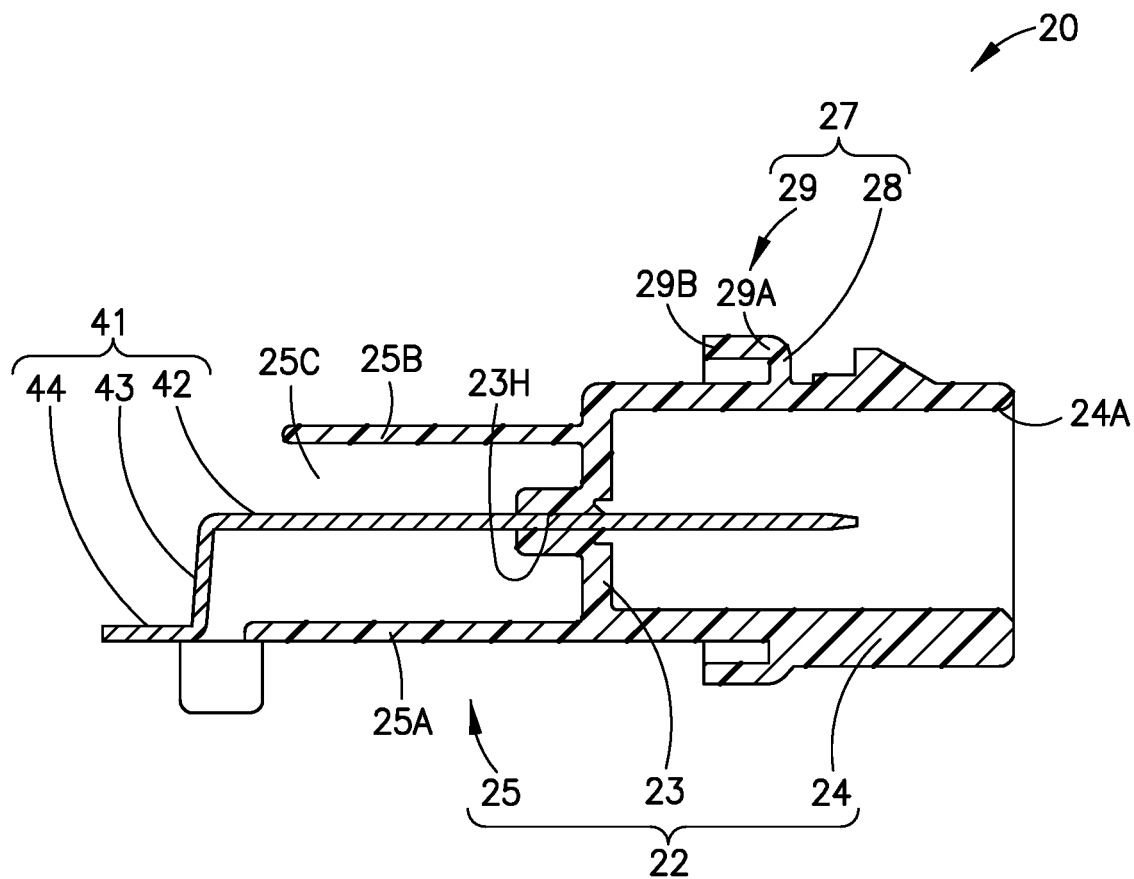
FIG. 6 is a section along B-B of FIG. 4.

As shown in FIG. 6, the housing body 22 includes a terminal holding wall 23, a receptacle 24 continuous from the terminal holding wall 23 and a surrounding wall 25 likewise continuous from the terminal holding wall 23.

As shown in FIG. 6, the terminal holding wall 23 is a substantially plate-like part for holding the terminal fittings 41 and includes a plurality of press-fit holes 23H into which the terminal fittings 41 can be press-fit. As shown in FIG. 6, the receptacle 24 is a rectangular tubular part extending from one surface of the terminal holding wall 23 and has an opening 24A on a side opposite to the terminal holding wall 23. A mating connector can be received into an internal space of the connector housing 21 surrounded by the terminal holding wall 23 and the receptacle 24.

As shown in FIG. 6, the surrounding wall 25 is a rectangular tubular part extending from the terminal holding wall 23 in a direction opposite to the receptacle 24, and is composed of a bottom wall 25A arranged along the circuit board 10, a ceiling wall 25B parallel to the bottom wall 25A and first and second side walls 25C linking the bottom wall 25A and the ceiling wall 25B. Each of the side walls 25C includes a mounting groove 26, as shown in FIG. 4.

As shown in FIG. 6, the cut-off receiving portion 27 includes a flange 28 (corresponding to a projection) extending vertically out from the receptacle 24 and a flexible wall 29 extending horizontally from an extending end of the flange 28. The flexible wall 29 extends toward the terminal holding wall 23 (leftward direction of FIG. 6) from the flange 28. The flexible wall 29 is arranged parallel to the receptacle 29 while being spaced apart from the receptacle 29 in a state before the resin portion 50 is formed by molding, and can be deflected in the direction toward the receptacle 24 with an end thereof connected to the flange 28 serving as a base end 29A and an opposite end serving as a free end 29B. The cut-off receiving portion 27 is arranged over the entire periphery of the receptacle 24.

Each of the two fixing brackets 31 is formed by press-working a metal plate material and, as shown in FIG. 3, includes a substantially rectangular body 32 and a mounting portion 33 in the form of a plate extending perpendicularly from one side of the body 32 so that each fixing bracket 31 is L-shaped. Although not shown in detail, locking pieces are arranged on each of two side edges (two sides perpendicular to the one side connected to the mounting portion 33) of the body 32, and engagement receiving portions with which the locking pieces are engaged are arranged on groove walls of each mounting groove 26.

Figure 4:
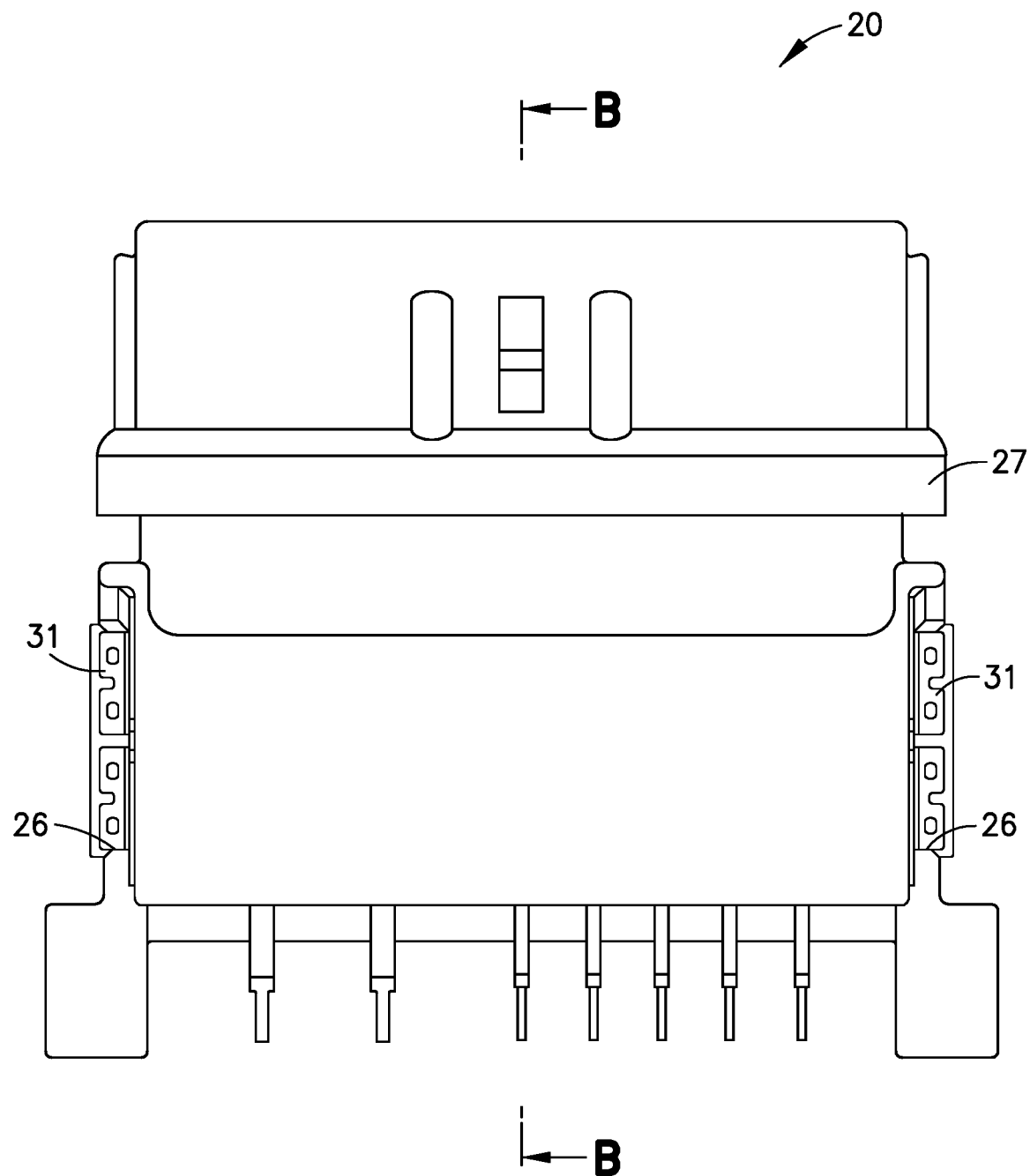
FIG. 4 is a plan view of the connector of the embodiment.
Figure 5:
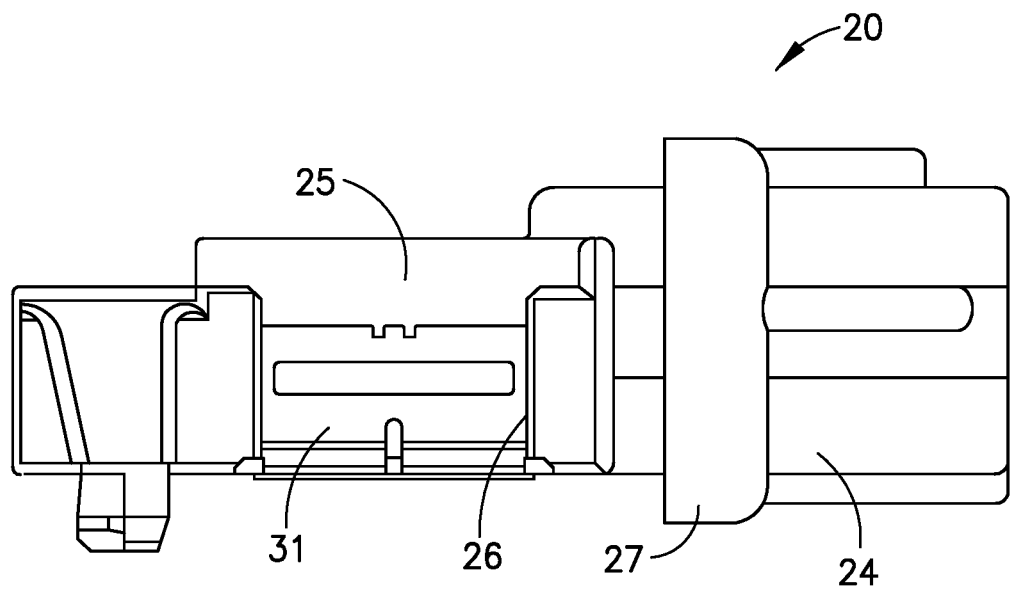
FIG. 5 is a side view of the connector of the embodiment.

As shown in FIG. 4, one fixing bracket 31 is accommodated in the mounting groove 26 disposed in the first side wall 25C and the other fixing bracket 31 is accommodated in the mounting groove 26 disposed in the second side wall 25C. Each fixing bracket 31 is held positioned by the engagement of the locking pieces with the engagement receiving portions.

Each of the terminal fittings 41 is formed by bending an elongated plate material made of metal and, as shown in FIG. 6, is composed of a tab 42 penetrating through the terminal holding wall 23, an intermediate portion 43 extending substantially perpendicularly from one end of the tab 42 and a board connecting portion 44 extending in a direction opposite to the tab 42 from an extending end of the intermediate portion. A tip of the tab 42 is arranged inside the receptacle 24. The intermediate portion 43 and the board connecting portion 44 are arranged outside the connector housing 21.

With the connector 20 assembled with the circuit board 10, a part of the receptacle 24 where the cut-off receiving portion 27 is provided and a part thereof closer to the opening 24A than the former part project outward (rightward of FIG. 2) from an end edge of the circuit board 10 and the remaining part is arranged along one surface of the circuit board 10, as shown in FIG. 2. The board connecting portions 44 are arranged along the circuit board 10 and electrically connected to the conductive paths by reflow soldering. Further, although not shown in detail, the mounting portions 33 are disposed along the circuit board 10 and fixed to the circuit board 10 by reflow soldering.

As shown in FIG. 2, the resin portion 50 covers the entire circuit board 10 and most of the connector 20 while being held in close contact with these. The circuit board 10 is embedded entirely in the resin portion 50. A part of the connector 20 adjacent to the opening 24A projects from the resin portion 50 and the remaining part is embedded in the resin portion 50.

The ECU 1 configured as described above is manufactured, for example, in the following procedure.

First, the terminal fittings 41 and the fixing brackets 31 are mounted into the connector housing 21.

Subsequently, the connector 20 is fixed to the circuit board 10 by reflow soldering. First, solder is applied in advance to each part of the one surface of the circuit board 10 where soldering is planned. Subsequently, the connector 20 is placed on the one surface of the circuit board 10. At this time, the part of the receptacle 24 where the cut-off receiving portion 27 is provided and the part thereof closer to the opening 24A than the former part project from the end edge of the circuit board 10, and the remaining part is arranged along the one surface of the circuit board 10. With the connector 20 placed on the circuit board 10, the board connecting portion 44 of each terminal fitting 41 is placed on the solder and the mounting portion 33 of each fixing bracket 31 also similarly is placed on the solder. Subsequently, the circuit board 10 having the connector 20 placed thereon is caused to travel in an unillustrated reflow furnace to melt the solder.

Subsequently, the circuit board 10 having the connector 20 placed thereon is caused to travel in an unillustrated reflow furnace to melt the solder. The solder is cooled and hardened thereafter. Thus, the board connecting portion 44 of each terminal fitting 41 is fixed to the corresponding conductive path to establish conduction and the mounting portion 33 of each fixing bracket 31 is fixed to the circuit board 10.

Figure 7:
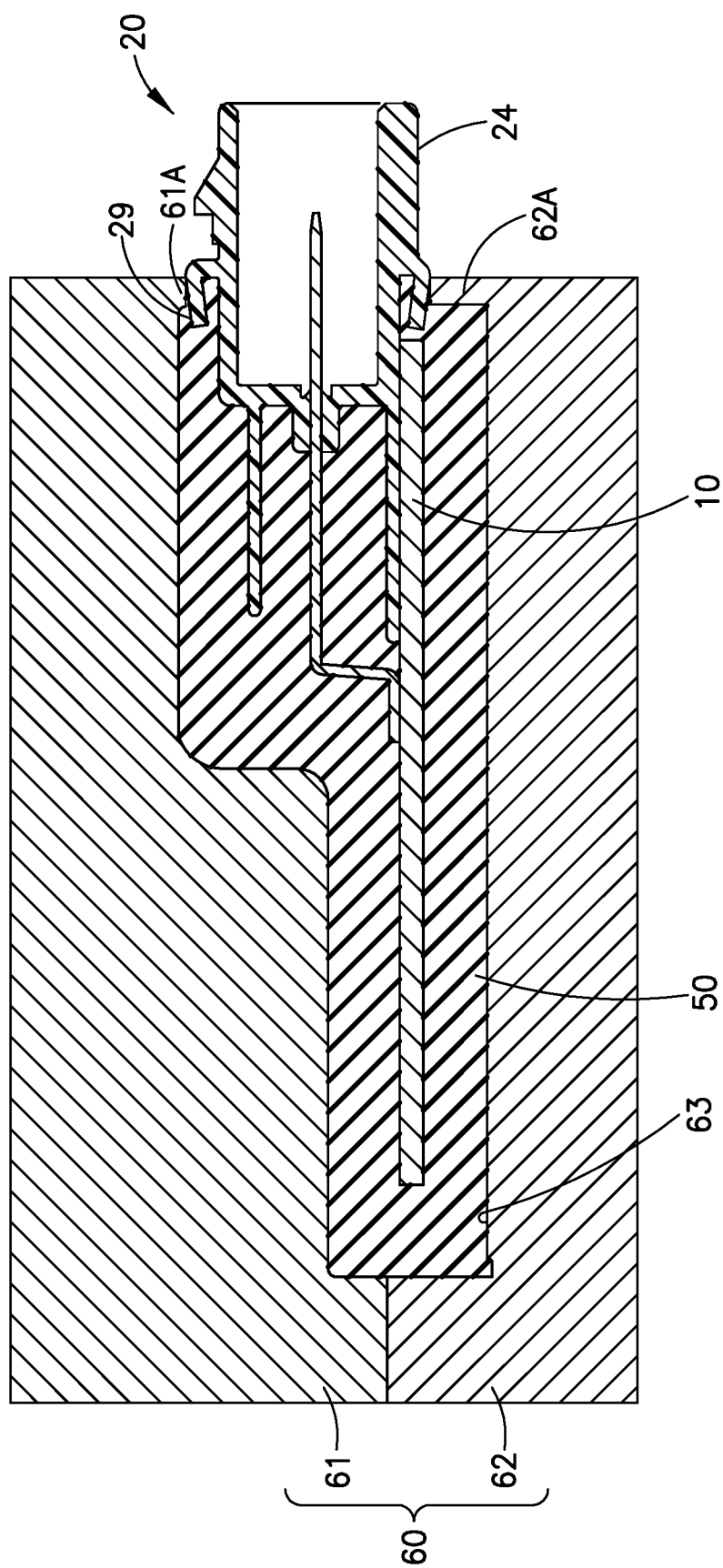
FIG. 7 is a section showing a state where a resin portion is formed in the embodiment.

Subsequently, the resin portion 50 is formed by molding. As shown in FIG. 7, a mold 60 for molding is composed of an upper mold 61 and a lower mold 62 that can be opened and closed in the vertical direction, and a cavity 63 is formed inside the mold 60 in conformity with the shape of the resin portion 50.

The circuit board 10 having the connector 20 fixed thereto is set in the lower mold 62 and covered with the upper mold 61 from above, and the mold 60 is closed (setting step). The upper mold 61 is provided with an upper mold cut-off portion 61A (cut-off portion), the lower mold 62 is provided with a lower mold cut-off portion 62A (cut-off portion), and the connector housing 21 is sandwiched firmly by the upper mold 61 and the lower mold 62 with the upper mold cut-off portion 61A and the lower mold cut-off portion 62A held in contact with the flexible wall 29 over the entire periphery. The flexible wall 29 is pressed by the upper mold cut-off portion 61A and the lower mold cut-off portion 61A to be deflected toward the receptacle 24. The upper mold cut-off portion 61A and the lower mold cut-off portion 62A are pressed strongly against the flexible wall 29 by a restoring force of the flexible wall 29. Contact pressures of the upper mold cut-off portion 61A and the lower mold cut-off portion 62A are not received directly by the receptacle 24, but are received by the flexible wall 29 in this way. Thus, the deformation of the receptacle 24 can be suppressed.

Subsequently, molten resin is poured into the cavity 63 formed in the mold 60 (resin portion forming step). At this time, a flow of the resin to the outside of the mold 60 is cut off (resin cut-off) between the upper mold cut-off portion 61A, the lower mold cut-off portion 62A and the flexible wall 29 since the upper mold cut-off portion 61A and the lower mold cut-off portion 62A are strongly pressed against the flexible wall 29.

When the inside of the mold 60 is filled with the resin, the resin is cooled and cured. In this way, the resin portion 50 is formed.

When the resin is cured, the mold 60 is opened in the vertical direction and the completed ECU 1 is taken out from the mold. In the resin portion forming step, the molten resin is poured and cured with the flexible wall 29 deflected by the upper mold cut-off portion 61A and the lower mold cut-off portion 62A. Thus, in the completed ECU 1, the flexible wall 29 is inclined so that the free end 29B is closer to the receptacle 24 than the base end 29A and constitutes an inclined wall. The free end 29B is embedded in the resin portion 50 and the remaining part including the base end 29A (part in contact with the upper mold cut-off portion 61A and the lower mold cut-off portion 62A at the time of molding) is exposed to outside from the resin portion 50.

As described above, the ECU 1 of this embodiment includes the circuit board 10, the connector 20 fixed to the circuit board 10 and the resin portion 50 covering the circuit board 10 and the connector 20. The connector 20 includes the housing body 22 and the cut-off receiving portion 27 projecting from the housing body 22. The cut-off receiving portion 27 includes the flange 28 projecting out from the housing body 22 and the flexible wall 29 extending from the flange 28 and inclined to be closer to the housing body 22 toward the tip, and a part of the flexible wall 29 is embedded in the resin portion 50.

Further, a method for manufacturing the ECU 1 of this embodiment includes the setting step of setting the circuit board 10 and the connector 20 fixed to the circuit board 10 in the mold 60 and the resin portion forming step of pouring the molten resin into the mold 60 and curing the molten resin. The mold 60 includes the upper mold cut-off portion 61A and the lower mold cut-off portion 62A for cutting off the flow of the resin to the outside of the mold 60 between the connector 20 and the mold 60 by pressing the connector 20. The connector 20 includes the housing body 22 and the cut-off receiving portion 27 projecting from the housing body 22, and the cut-off receiving portion 27 includes the flange 28 projecting out from the housing body 22 and the flexible wall 29 extending from the flange 28 and deflectable toward the housing body 22. In the resin portion forming step, the upper mold cut-off portion 61A and the lower mold cut-off portion 62A press the flexible wall 29.

According to the above configuration, pressing forces from the upper mold cut-off portion 61A and the lower mold cut-off portion 62A provided in the mold 60 can be received by the flexible wall 29 in the step of molding the resin portion 50. Thus, the deformation of the housing body 22 can be avoided.

Further, the housing body 22 includes the tubular receptacle 24 capable of accommodating the mating connector inside, and the cut-off receiving portion 27 is continuous from the receptacle 24.

Since the receptacle 24 is hollow inside, the receptacle 24 may be deformed if directly receiving the pressing forces by the upper mold cut-off portion 61A and the lower mold cut-off portion 62A. Since the cut-off receiving portion 27 is continuous from the receptacle in this embodiment, the deformation of the receptacle 24 can be suppressed.

Further, since the cut-off receiving portion 27 is arranged over the entire periphery of the housing body 22, the deformation of the housing body 22 can be avoided.

The invention is not limited to the above described and illustrated embodiment. For example, the following various modes also are included.

Although the flexible wall 29 extends in the direction toward the terminal holding wall 23 (leftward direction of FIG. 2) from the flange portion 28 in the above embodiment, a flexible wall may extend in a direction toward the opening 24A of the receptacle 24 (rightward direction of FIG. 2) from the flange portion 28.

Although the cut-off receiving portion 27 extends from the receptacle 24 in the above embodiment, a cut-off receiving portion may be continuous from a part of the housing body 22 different from the receptacle 24.

The cut-off receiving portion 27 is arranged over the entire periphery of the housing body 22 in the above embodiment. However, even if a cut-off receiving portion is arranged only on a part of the housing body 22, a certain effect of suppressing the deformation of the housing body 22 is exhibited.

LIST OF REFERENCE SIGNS

1: ECU (circuit device)
10: circuit board
20: connector
22: housing body
24: receptacle
27: cut-off receiving portion
28: flange portion (projecting portion)
29: flexible wall (inclined wall)
50: resin portion
60: mold
61A: upper mold cut-off portion (cut-off portion)
62A: lower mold cut-off portion (cut-off portion)

The invention claimed is:

1. A circuit device, comprising:
a circuit board;
a connector fixed to the circuit board; and
a resin portion covering the circuit board and the connector,
wherein:
the connector includes a housing body and a cut-off receiving portion projecting from the housing body, and
the cut-off receiving portion includes a projecting portion projecting outward from the housing body and an inclined wall extending from the projecting portion and the inclined wall having a tip spaced from the projecting portion, the inclined wall being inclined to be closer to the housing body toward the tip of the inclined wall and a part of the inclined wall is embedded in the resin portion.

2. The circuit device of claim 1, wherein:
the housing body includes a tubular receptacle capable of accommodating a mating connector inside, and
the cut-off receiving portion is continuous from the receptacle.

3. The circuit device of claim 2, wherein the cut-off receiving portion is arranged over an entire periphery of the housing body.

4. The circuit device of claim 1, wherein the cut-off receiving portion is arranged over an entire periphery of the housing body.

5. The circuit device of claim 1, wherein the projecting portion of the connector extends transverse to the circuit board.

6. The circuit device of claim 1, wherein the connector includes a terminal fitting with a tab, the projecting portion extending transverse to the tab.

7. A method for manufacturing a circuit device, comprising:
- a setting step of setting a circuit board and a connector fixed to the circuit board in a mold; and
- a resin portion forming step of forming a resin portion covering the circuit board and the connector by pouring molten resin into the mold and curing the molten resin, wherein:
the mold includes a cut-off portion for cutting off a flow of the resin to outside of the mold between the mold and the connector by pressing the connector,
the connector includes a housing body and a cut-off receiving portion projecting from the housing body,
the cut-off receiving portion includes a projecting portion projecting outward from the housing body and a flexible wall extending from the projecting portion and deflectable toward the housing body, and
the cut-off portion presses the flexible wall in the resin portion forming step.

8. A connector, comprising:
- a housing body formed from a synthetic resin; and
- a cut-off receiving portion formed continuously with the housing body and projecting from the housing body,
wherein the cut-off receiving portion includes a projecting portion projecting outward from the housing body and a flexible wall extending from the projecting portion and the flexible wall having a tip spaced from the projecting portion, the flexible wall being deflectable toward the housing body and into an inclined posture where the tip of the flexible wall is closer to the housing body than an end of the flexible wall that extends from the projecting portion.

9. The connector of claim 8, wherein the cut-off receiving portion is arranged over an entire periphery of the housing body.

10. The connector of claim 8, further including a terminal fitting with a tab, the projecting portion extending transverse to the tab.

* * * * *